(12) United States Patent
Gardes

(10) Patent No.: US 6,884,726 B2
(45) Date of Patent: Apr. 26, 2005

(54) METHOD FOR HANDLING A THIN SILICON WAFER

(75) Inventor: Pascal Gardes, Tours (FR)

(73) Assignee: STMicroelectronics S.A., Montrouge (FR)

(*) Notice: Subject to any disclaimer, the term of this patent is extended or adjusted under 35 U.S.C. 154(b) by 269 days.

(21) Appl. No.: 10/217,577

(22) Filed: Aug. 13, 2002

(65) Prior Publication Data
US 2003/0032294 A1 Feb. 13, 2003

(30) Foreign Application Priority Data
Aug. 13, 2001 (FR) .......................................... 01 10768

(51) Int. Cl.$^7$ ........................................... H01L 21/302
(52) U.S. Cl. ........................ 438/694; 438/654; 438/704
(58) Field of Search ............................... 438/654, 694, 438/704, 745, 753, 756, 757

(56) References Cited

U.S. PATENT DOCUMENTS

| | | | |
|---|---|---|---|
| 4,009,540 A | | 3/1977 | Uijen |
| 5,071,792 A | * | 12/1991 | VanVonno et al. ............. 438/17 |
| 5,336,930 A | * | 8/1994 | Quach ......................... 257/774 |
| 5,504,033 A | * | 4/1996 | Bajor et al. .................. 438/405 |
| 5,593,917 A | | 1/1997 | Nuyen |
| 5,661,333 A | | 8/1997 | Bruel et al. |
| 5,681,775 A | * | 10/1997 | Pogge .......................... 438/406 |
| 5,827,751 A | | 10/1998 | Nuyen |
| 5,882,532 A | * | 3/1999 | Field et al. ...................... 216/2 |
| 6,010,591 A | | 1/2000 | Gösele |
| 6,566,158 B2 | * | 5/2003 | Eriksen et al. ................ 438/53 |
| 6,730,595 B2 | * | 5/2004 | Saimoto et al. ............. 438/654 |
| 2001/0005043 A1 | | 6/2001 | Nakanishi et al. |

OTHER PUBLICATIONS

French Search Report from French Patent Application 01/10768, filed Aug. 13, 2001.
Patent Abstracts of Japan, vol. 018, No. 617 (E–1634), Nov. 24, 1994 & JP 06 236975 A (Sony Corp.), Aug. 23, 1994.

* cited by examiner

*Primary Examiner*—Kin-Chan Chen
(74) *Attorney, Agent, or Firm*—Lisa K. Jorgenson; William R. McClellan; Wolf, Greenfield & Sacks, P.C.

(57) ABSTRACT

A method for handling a thin silicon wafer including the steps of successively forming on a surface of the wafer a first protection layer, a first etch stop layer, and an external layer; forming on a surface of a support wafer a gluing layer of the same material as the external layer of the wafer, the surface of the support wafer including a plurality of pads, the respective upper portions of which are substantially planar and coplanar; fastening, by direct gluing, the external layer of the wafer and the gluing layer of the support wafer; processing the wafer to form circuits therein; depositing a second protection layer on the wafer surface which is not glued to the support wafer; and removing by an etch process the material forming the external layer of the wafer and the gluing layer of the support wafer.

22 Claims, 1 Drawing Sheet

METHOD FOR HANDLING A THIN SILICON WAFER

BACKGROUND OF THE INVENTION

1. Field of the Invention

The present invention generally relates to the manufacturing of circuits in thin silicon wafers. More specifically, the present invention relates to the handling of such wafers.

The manufacturing of circuits is sometimes performed in particularly thin silicon wafers, for example, of a thickness smaller than 200 or 100 μm. Such wafers are very difficult to handle due to their sensitivity to shocks. To reduce risks of cleavage or breakage upon handling operations, it has been provided to fasten or glue the unprocessed surface of the wafer to another protection and handling wafer which will be called the support-wafer hereafter. The gluing is performed to enable subsequent separation of the wafer without damaging the wafer or the support wafer, to be able to use the support wafer again.

2. Discussion of the Related Art

Conventional sequences of separation of a wafer from a support wafer will be described hereafter in relation with FIGS. 1A, 1B, and 1C.

FIG. 1A illustrates, in a simplified cross-section view, a thin silicon wafer 1 glued by direct gluing on a support wafer 3 (FIG. 1B). The separation is here performed by means of a specific device 10 (FIG. 1C). The surface of wafer 1 glued to the support wafer is covered with a silicon oxide layer 2. Layer 2 generally is a specifically-deposited layer. Such a deposition is performed so that the external surface of layer 2 is substantially planar.

FIG. 1B illustrates, in a simplified cross-section view, an example of a support wafer 3. Support wafer 3 is a silicon wafer having dimensions identical to those of the wafer 1 that it is intended to receive. However, the thickness of support wafer 3, of at least 200 μm, is greater than that of wafer 1. The surface of support wafer 3 intended to receive wafer 1 includes a plurality of pads 4. Pads 4 are separated by intervals 5 which all communicate. Pads 4 have the same height and exhibit, at a macroscopic level, a substantially planar upper surface. The entire support wafer 3 (pads 4 and intervals 5) is covered with a silicon oxide layer 6. Layer 6 results either from a thermal oxidation of support wafer 3, or from the deposition of a specific layer.

Thin wafer 1 and support wafer 3 are glued by direct gluing and welded by an adhesion anneal. Then, wafer 1 is handled during the circuit forming via support wafer 3.

FIG. 1C schematically shows a cross-section view of a device 10 for separating thin wafer 1 from support wafer 3.

Device 10 appears in the form of a cylindrical box. The bottom of the box includes a horizontal plate 11 from which protrudes a vertical wall 12. A peripheral ring 13 having a substantially rectangular cross-section bears against plate 11. The planar upper surface of ring 13 supports a gasket 14. Plate 11 also supports a gasket 15.

As illustrated in FIG. 1C, upon separation, support wafer 3 and wafer 1 are altogether placed in separation device 10 so that support wafer 3 is on gasket 15.

Separation device 10 is then closed back by a cover 16. Cover 16 includes a peripheral ring 17 protruding to the outside of device 10. Ring 17 is similar to ring 13 and contacts gasket 14. The central portion of cover 16 supports a gasket 18. Gasket 18 is placed so that it bears against wafer 1 and support wafer 3 altogether above gasket 15. Cover 16 is aligned and locked by the screwing of several screws 19 distributed on its periphery, and passing through ring 17 to screw in ring 13.

Cover 16 being closed, the separating of the assembly of wafer 1 and of support wafer 3 is performed by injecting gas between silicon oxide layers 2 and 6. Such a separating has many disadvantages.

A first disadvantage is that such a separation imposes constraints on the roughnesses of layers 2 and 6. Indeed, the smaller the roughness of layers 2 and 6, the greater the adherence between wafer 1 and support wafer 3. Under a given roughness, the separation becomes difficult (or even impossible) and requires pressures and injection flows which break wafer 1 and support wafer 3. A compromise must thus be made between sufficiently rough layers 2 and 6 to ensure sufficient adherence to enable handling of the assembly, while maintaining a sufficient roughness for the separation to be possible in reasonable time and pressure conditions.

Another disadvantage of the separation is that it imposes limits on the thermal processings of the assembly. Indeed, the adherence of layers 2 and 6 is increased upon high-temperature anneals. The anneal durations and temperatures must thus be limited for the separation to still be possible. Such limitations of the anneal conditions do not enable forming any circuit in thin wafers.

Another disadvantage is the necessary use of human intervention to monitor or perform the screwing of cover 16. Indeed, the pressure exerted by gaskets 15 and 18 on wafer 1 must be controlled, upon closing of cover 16, since, in case of too high or too low a pressure, wafer 1 risks being damaged upon separation. Indeed, under the effect of the injected gases, it tends to be slightly lifted with respect to support wafer 3. If gasket 18 is too crushed against wafer 1, it cannot damp (absorb) this lifting. Then, wafer 1 deforms, cleaves and breaks. Conversely, if gasket 18 is insufficiently compressed against wafer 1, upon lifting of wafer 1, either said wafer can be projected against gasket 18, or a lateral clearance can appear and wafer 1 may hit against the walls of device 10. Further, the thickness of the assembly of wafer 1 and of support wafer 3 is not known and may slightly vary. Further, gaskets 18 and 15 may be partially damaged (crushed).

Another disadvantage is the need to control the rate of inflow of the separation gas. Indeed, if the flow is high, the unglued portions of wafer 1 are abruptly raised and tear the portions glued to pads 4. The gas injection flow must thus be progressively increased. Further, if the gas injection is maintained at a high flow at the end of the separation, an abrupt upraising of wafer 1 may be caused, which results in risks of shocks against gasket 18. These injection control constraints further complicate and slow down the separation process.

SUMMARY OF THE INVENTION

The present invention aims at providing a method for handling a wafer on a support wafer that overcomes at least the previously-discussed disadvantages.

To achieve these and other objects, the present invention provides a method for handling a thin silicon wafer including the steps of:

successively forming on a surface of the wafer a first protection layer, a first etch stop layer, and an external layer;

forming on a surface of a support wafer a gluing layer of the same material as the external layer of the wafer, the surface of the support wafer including a plurality of pads, the respective upper portions of which are substantially planar and coplanar;

fastening, by direct gluing, the external layer of the wafer and the gluing layer of the support wafer;

further including, after any processing appropriate to the forming of circuits in the wafer, the following separation steps:

depositing a second protection layer on the wafer surface which is not glued to the support wafer; and removing by an etch process the material forming the external layer of the wafer and the gluing layer of the support wafer.

According to an embodiment of the present invention, the material forming the external layer of the wafer and the gluing layer of the support wafer is silicon oxide.

According to an embodiment of the present invention, the first protection layer is a silicon oxide layer.

According to an embodiment of the present invention, the first etch stop layer is silicon nitride or polysilicon.

According to an embodiment of the present invention, a second etch stop layer is superposed to the second protection layer.

According to an embodiment of the present invention, the second etch stop layer is silicon nitride or polysilicon.

According to an embodiment of the present invention, the second protection layer is polysilicon.

According to an embodiment of the present invention, the removal step is performed by flowing an appropriate etch solution in intervals separating the pads.

According to an embodiment of the present invention, the removal step includes dipping at least one assembly of a wafer and of a support wafer in an appropriate etch bath.

According to an embodiment of the present invention, the removal step is followed by a drying.

The foregoing objects, features, and advantages of the present invention, will be discussed in detail in the following non-limiting description of specific embodiments in connection with the accompanying drawings.

DETAILED DESCRIPTION

For clarity, the same elements are designated with the same references in the different drawings. Further, as usual in the representation of semiconductors, the various drawings are not to scale.

Figure 1A:
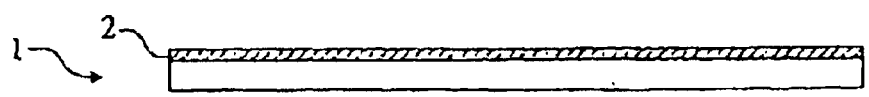
FIG. 1A illustrates, in a simplified cross-section view, a thin silicon wafer, to be separated from a support wafer.
Figure 1B:
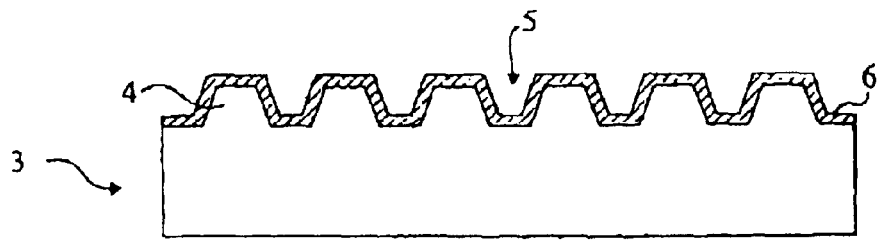
FIG. 1B illustrates, in a simplified cross-section view, a support wafer intended to receive a thin silicon wafer.

The present invention uses, to handle a thin silicon wafer 20, a support wafer 30 similar to the conventional support wafer described in relation with FIG. 1B coated with an external gluing layer 26, for example, silicon oxide.

Wafer 20 to be glued on/separated from support wafer 30 is prepared according to the present invention as follows. First, a protection layer 21, for example, silicon oxide, is deposited so that its upper surface is substantially planar. It can be necessary to level layer 21, for example, by performing a chem-mech polishing. Then, an etch stop layer 22 followed by an external layer 23 are deposited on protection layer 21. Etch stop layer 22 is made of any material selectively etchable with respect to layer 23 and, preferably, with respect to protection layer 21.

External layers 23 and 26 are made of the same material, for example, silicon oxide. Etch stop layer 22 is thus made of any material selectively etchable with respect to silicon oxide, for example, silicon nitride or polysilicon.

Wafer 20 and support wafer 30 are then assembled by direct gluing.

Figure 2:
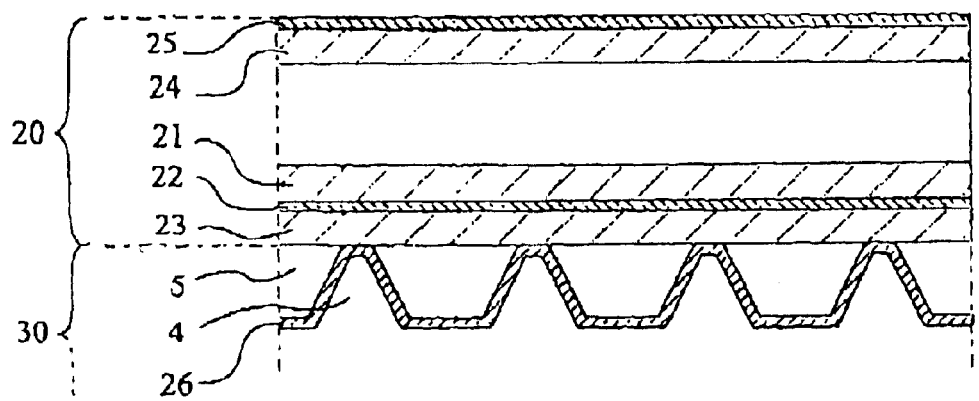
FIG. 2 illustrates, in a simplified partial cross-section view, the assembly according to the present invention of a thin silicon wafer on a support wafer before implementation of the separation method according to the present invention.

After the various processings necessary to form the circuits in wafer 20, its external surface (unglued) is protected, as illustrated in FIG. 2, by the successive forming of a protection layer 24 and of an etch stop layer 25. Etch stop layer 25 is chosen to be selectively etchable with respect to protection layer 24 and with respect to glued layers 26 and 23. Preferably, protection layer 24 is of same nature as protection layer 21 and etch stop layer 25 is of same nature as etch stop layer 22.

The separation of wafer 20 from support wafer 30 is then performed by eliminating, according to the present invention, silicon oxide glued layers 26 and 23. This is carried out by flowing in intervals 5, between pads 4, an appropriate etch solution, for example, by dipping the assembly of wafer 20 and of support wafer 30 in an etch bath. The etch bath is for example HF-based. The separation is completed by a drying, for example, a steaming. Indeed, after removal of glued layers 26 and 23, support wafer 30 and wafer 20 may still form one block by capillarity due to the presence of the etch solution and of water.

Figure 1C:
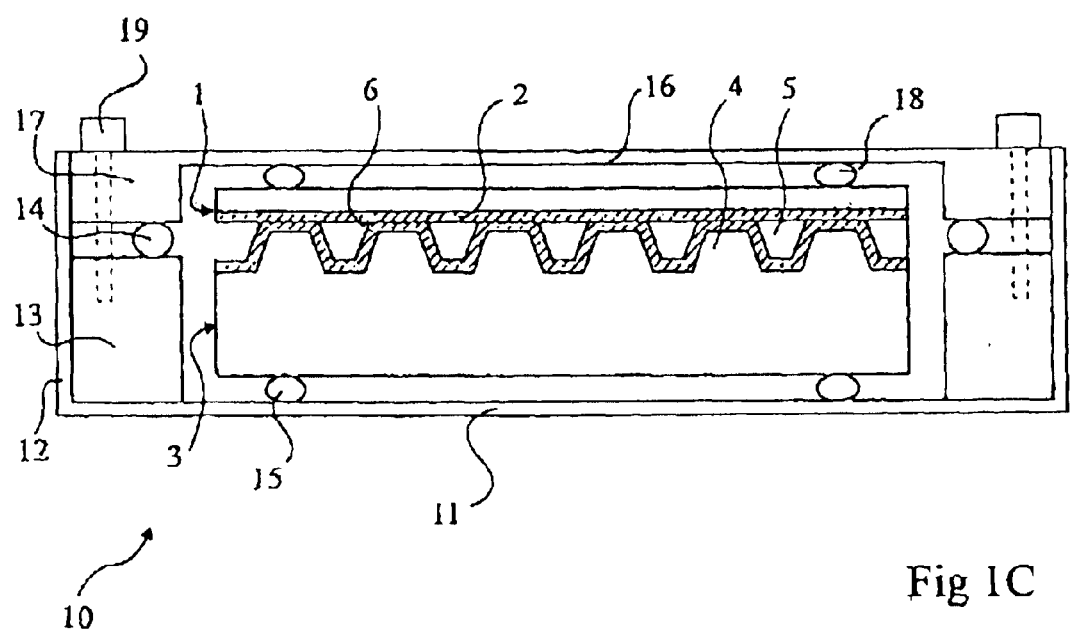
FIG. 1C illustrates, in a simplified cross-section view, a device conventionally used to separate a thin silicon wafer from a support wafer.

An advantage of the handling method according to the present invention is the fact that the separation step now no longer requires use of the commonly used device (10, FIG. 1). This results in a time gain and in a significant decrease in wafer cleavage and breakage risks.

Another advantage is that the separation step can be implemented for wafer batches. Indeed, the etch and drying operations can be simultaneously performed for several assemblies of a wafer and of a support wafer. Conversely, the conventional separation step only enables separating a single wafer per separation device.

Another advantage of the handling method according to the present invention is the fact that the adherence level of layers 26 and 23 has no incidence upon the separation. Accordingly, a control of the roughness of layers 26 and 23 is not necessary. The gluing step is thus simplified and the time gain is further increased. Further, the assembly can be submitted to any appropriate thermal processing (anneal) for as long and at as high a temperature as necessary.

The present invention can have various alterations, modifications, and improvements which will readily occur to those skilled in the art. In particular, the nature of protection layers 21 and 24, of etch stop layers 22 and 25, and/or of external layers 26 and 23 may be modified in any appropriate manner. It will however be ascertained to choose for the external layers materials enabling direct gluing such as previously described. External layers 26 and 23 and protection layers 21 and 24 may be made of different materials selectively etchable with respect to each other. Then, etch stop layers 22 and 25 are omitted. Etch stop layers 22 and 25 are however maintained in place if the gluing and protection layers are made of different materials, not selectively etchable.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for handling a thin silicon wafer including the steps of:
   successively forming on a surface of the wafer a first protection layer, a first etch stop layer, and an external layer;
   forming on a surface of a support wafer a gluing layer of the same material as an external layer of the wafer, the surface of the support wafer including a plurality of pads, respective upper portions of which are substantially planar and coplanar;
   fastening, by direct gluing, the external layer of the wafer and the gluing layer of the support wafer;
   processing the wafer to form circuits therein;
   depositing a second protection layer on the wafer surface which is not glued to the support wafer; and
   removing by an etch process the material forming the external layer of the wafer and the gluing layer of the support wafer.

2. The method of claim 1, wherein the material forming the external layer of the wafer and the gluing layer of the support wafer is made of silicon oxide.

3. The method of claim 1, wherein the first protection layer is made of silicon nitride or polysilicon.

4. The method of claim 1, wherein the first etch stop layer is made of silicon nitride or polysilicon.

5. The method of claim 1, wherein a second etch stop layer is superposed to the second protection layer.

6. The method of claim 5, wherein the second etch stop layer is made of silicon nitride or polysilicon.

7. The method of claim 1, wherein the second protection layer is made of polysilicon.

8. The method of claim 1, wherein the removal step is performed by flowing an appropriate etch solution in intervals separating the pads.

9. The method of claim 1, wherein the removal step includes dipping at least one assembly of a wafer and of a support wafer in an appropriate etch bath.

10. The method of claim 1, wherein the removal step is followed by a drying.

11. A method for handling a semiconductor wafer, comprising:
    forming on a surface of the wafer a first protection layer, a first etch stop layer, and an external layer;
    forming on a surface of a support wafer an external layer of a same material as the external layer on the wafer, the surface of the support wafer including a plurality of pads;
    fastening, with an adhesive, the external layer on the wafer and the external layer on the support wafer;
    processing the wafer to form circuitry;
    depositing a second protection layer on the wafer surface which is not fastened to the support wafer; and
    removing, by an etch process, the external layer on the wafer and the external layer on the support wafer.

12. A method as defined in claim 11, wherein the pads on the support wafer are substantially coplanar.

13. A method as defined in claim 11, wherein the pads on the support wafer are substantially coplanar.

14. A method as defined in claim 12, wherein the external layer on the wafer and the external layer on the support wafer are silicon oxide.

15. A method as defined in claim 12, wherein the first protection layer is fabricated of silicon nitride or polysilicon.

16. A method as defined in claim 11, wherein the first etch stop layer is fabricated of silicon nitride or polysilicon.

17. A method as defined in claim 11, further comprising forming a second etch stop layer on the second protection layer.

18. A method as defined in claim 11, wherein removing comprises flowing an etch solution in spaces between the pads.

19. A method as defined in claim 11, wherein removing comprises dipping the wafer and the support wafer in an etch bath.

20. A method for handling a semiconductor wafer, comprising:
    forming an external layer on a surface of a wafer;
    forming an external layer on a surface of a support wafer;
    fastening, with an adhesive, the external layer on the wafer and the external layer on the support wafer;
    processing the wafer; and
    removing, by an etch process, the external layer on the wafer and the external layer on the support wafer.

21. A method as defined in claim 20, wherein the surface of the support wafer includes a plurality of substantially coplanar pads.

22. A method as defined in claim 21, wherein removing comprises flowing an etch solution in spaces between the pads.

* * * * *